(12) United States Patent
Beckhoff et al.

(10) Patent No.: US 10,483,664 B2
(45) Date of Patent: Nov. 19, 2019

(54) ELECTRONIC TERMINAL BLOCK FOR A DATA BUS

(71) Applicant: BECKHOFF AUTOMATION GMBH, Verl (DE)

(72) Inventors: Hans Beckhoff, Verl (DE); Michael Jost, Dörentrup (DE); Martin Podrouschek, Halle (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 16/176,931

(22) Filed: Oct. 31, 2018

(65) Prior Publication Data
US 2019/0067842 A1 Feb. 28, 2019

Related U.S. Application Data

(63) Continuation of application No. PCT/EP2017/060669, filed on May 4, 2017.

(30) Foreign Application Priority Data

May 4, 2016 (DE) .................... 10 2016 108 321

(51) Int. Cl.
*H05K 7/14* (2006.01)
*H01R 9/26* (2006.01)

(52) U.S. Cl.
CPC ......... *H01R 9/2658* (2013.01); *H01R 9/2608* (2013.01); *H05K 7/1468* (2013.01); *H05K 7/1469* (2013.01)

(58) Field of Classification Search
CPC ... H01R 9/2608; H01R 9/2658; H05K 7/1469
See application file for complete search history.

(56) References Cited

U.S. PATENT DOCUMENTS

| 4,729,744 A * | 3/1988 | Bet ...................... H02B 1/26 439/717 |
| 5,716,241 A * | 2/1998 | Hennemann ............ G06F 1/184 439/716 |

(Continued)

FOREIGN PATENT DOCUMENTS

| DE | 4402002 B4 | 7/1995 |
| DE | 202006006659 U1 | 7/2006 |

(Continued)

OTHER PUBLICATIONS

Imc CRONOSflex, obtained from http://www.imc-berlin.de/fileadmin/Public/Products/2014-Brochures/german2014/imc_CRONOSflex_de_2014_08_dp.pdf, English translation (7 pages).

*Primary Examiner* — Hoa C Nguyen
*Assistant Examiner* — Keith DePew
(74) *Attorney, Agent, or Firm* — Dorsey & Whitney LLP

(57) ABSTRACT

An electronic terminal block for a data bus has control electronics comprising first and second data-bus-contacting units connected via an internal data-bus line, and a connecting unit for connecting bus subscribers. The metal housing comprises a first face having a receptacle in a carrier rail, a second face having a recess for the connecting unit, a first side face, an opening for the first data-bus-contacting unit, and a second side face opposite the first side face with an opening for the second data-bus-contacting unit. A first non-metallic coupling plate for mounting onto the first housing side face comprises a first recess having an engagement feature in the region of the opening of the first side face, and a second non-metallic coupling plate for mounting onto the second side face comprises a first recess having an engagement feature in the region of the opening of the second side face.

23 Claims, 18 Drawing Sheets

(56) References Cited

U.S. PATENT DOCUMENTS

| | | | | |
|---|---|---|---|---|
| 6,038,130 A | * | 3/2000 | Boeck | H01R 9/2675 |
| | | | | 361/735 |
| 6,172,875 B1 | * | 1/2001 | Suzuki | G06F 1/183 |
| | | | | 361/679.4 |
| 6,431,909 B1 | | 8/2002 | Nolden et al. | |
| 9,936,598 B2 | * | 4/2018 | Gruber | H01R 9/2675 |
| 10,085,355 B2 | * | 9/2018 | Giefers | G06F 1/181 |
| 10,205,258 B1 | * | 2/2019 | Lee | H01R 13/514 |
| 2004/0244856 A1 | * | 12/2004 | Schauz | F15B 13/0821 |
| | | | | 137/884 |

FOREIGN PATENT DOCUMENTS

| | | |
|---|---|---|
| DE | 202008002113 U1 | 6/2009 |
| DE | 102013206147 A1 | 10/2014 |
| EP | 1484511 A1 | 12/2004 |

* cited by examiner ns*US 10,483,664 B2*

ELECTRONIC TERMINAL BLOCK FOR A DATA BUS

CROSS-REFERENCE TO RELATED APPLICATIONS

This application is a continuation of PCT Application No. PCT/EP2017/060669, filed May 4, 2017, which claims the priority of German Patent Application DE102016108321.6, filed May 4, 2016, and entitled ELEKTRONISCHE REIHENKLEMME FÜR EINEN DATENBUS; each of which are incorporated by reference herein, in their entirety and for all purposes.

FIELD

The present invention relates to an electronic terminal block for a data bus and a bus-terminal station.

BACKGROUND

In automation technology, electronic terminal blocks which will in the following also be referred to as bus terminals are used to connect sensors and actuators which provide or, respectively, request various signals via analogue and digital inputs and outputs to a control unit via a field bus without further wiring. The electronic terminal blocks serve to bundle the various sensor signals and to forward them to the control unit by means of a standardized bus signal or, respectively, to transduce the control commands of the control unit into corresponding signals for the actuators and to forward the signals to the actuators.

In this context, the electronic terminal blocks are frequently integrated on a shared carrier rail as a bus-terminal station wherein a bus coupler is provided as a head end, the bus coupler serving as an interface to the field bus and connecting the electronic terminal blocks to the control unit. The communication between the bus couplers and the individual electronic terminal blocks is carried out via an internal terminal bus wherein the bus-terminal connection is carried out via contacts in a wireless manner.

Bus-terminal stations normally allow for serially connecting electronic terminal blocks having a whole range of signal types. Another possibility is to back-fit the bus-terminal station with further bus terminals. Individual electronic terminal blocks may furthermore have their own intelligence in order to be able to carry out control tasks in a de-centralized manner without any interference from the control unit. Moreover, the bus-terminal station may comprise specific terminal blocks which are capable of directly addressing the power units of an automated system.

DE4402002A1 discloses a bus-terminal station in which electronic terminal blocks may be locked onto a carrier rail. In this arrangement, the individual terminal blocks comprise internal data-bus and current-supply lines which are dragged through the terminal housing, while contacts for the data-bus line and the current line are respectively provided at the side faces of the housing. By sliding the terminal blocks next to one another on the carrier rail, the contacts between the terminal blocks are automatically connected, thus forming continuous data-bus and supply lines.

Electronic terminal blocks are normally produced with a plastic housing. Due to electromagnetic shielding and heat development occurring in process technology, however, it is in many cases not possible to use such plastic electronic terminal blocks for measuring.

A bus-terminal station by the name of imc CRONOSflex is known in which the electrical terminal blocks have a metal housing which allows for use in a difficult process environment. The self-supporting metal housing of the electronic terminal blocks hereby has laterally elongated front and back plates forming a click mechanism in order to connect the electronic terminal blocks within the framework of the bus-terminal station. The data-bus and current-line contacts are arranged in the laterally protruding back plates and are plugged to the corresponding contacts of adjacent terminal blocks during assembly. However, in the imc CRONOSflex system gaps occur between the assembled electronic terminal blocks, thus increasing the installation size of the bus-terminal station. The click mechanism used during assembly additionally requires that when the bus-terminal station is enlarged, the further electronic terminal blocks be continuously added laterally to the already existing electronic terminal blocks, resulting in the fact that the arrangement of the electronic terminal blocks cannot be changed in a flexible manner.

SUMMARY

The present invention provides an improved electronic terminal block for a data bus and an improved bus-terminal station which may be characterized by a compact and flexible design and may also be used in a difficult process environment, in particular with respect to electromagnetic shielding and heat development.

According to a first aspect, an electronic terminal block for a data bus has control electronics comprising a first and a second data-bus-contacting unit connected via an internal data-bus line and a connecting unit for connecting bus subscribers. The electronic terminal further has a metal housing in which the control electronics are arranged and which comprises a first housing face having a receptacle in a carrier rail, a second housing face having a recess for the connecting unit of the control electronics, a first housing side face, a first opening for the first data-bus-contacting unit, and a second housing side face opposite to the first housing side face, which comprises a first opening for the second data-bus-contacting unit of the control electronics. The electronic terminal further has a first coupling plate for mounting onto the first housing side face, which comprises a first recess having an engagement feature in the region of the first opening of the first housing side face and a second coupling plate for mounting onto the second housing side face, which comprises a first recess having an engagement feature in the region of the first opening of the second housing side face. The first and the second coupling plates are made of a non-metallic material. The engagement features comprise protruding enclosures.

According to a further aspect, an electronic terminal block for a data bus has control electronics comprising an electrical contacting unit connected via an internal current line, a data-bus-contacting unit connected via an internal data-bus line and a connecting unit for connecting bus subscribers. The electronic terminal further has a metal housing in which the control electronics are arranged and which comprises a first housing face having a receptacle in a carrier rail, a second housing face having a recess for the connecting unit of the control electronics and a housing side face, wherein the housing side face comprises a first opening for the data-bus-contacting unit of the control electronics and a second opening for the electrical contacting unit of the control electronics. The electronic terminal further has a coupling plate for mounting onto the housing side face, which comprises a first recess having an engagement feature in the region of the first opening of the first housing side face as well as a second recess having an engagement feature in the region of the second opening of the housing side face. The coupling plate is made of a non-metallic material. The engagement features comprise protruding enclosures.

According to a further aspect, a bus-bar station comprising a bus coupler and a plurality of electronic terminal blocks which may be arranged side-by-side on a carrier rail. The electronic terminal bar comprises a metal housing in which the control electronics are arranged and which comprises a first housing face having a receptacle in a carrier rail, a second housing face having a recess for the connecting unit of the control electronics, a first housing side face, a first opening for the first data-bus-contacting unit, and a second housing side face which comprises a first opening for the second data-bus-contacting unit of the control electronics, a first coupling plate for mounting onto the first housing side face, which comprises a first recess having an engagement feature in the region of the first opening of the first housing side face, and a second coupling plate for mounting onto the second housing side face, which comprises a first recess having an engagement feature in the region of the first opening of the second housing side face. The first and second coupling plates are made of a non-metallic material. The engagement features comprise protruding enclosures.

EMBODIMENTS

An electronic terminal block for a data bus comprises control electronics comprising an electrical contacting unit connected via an internal current line, a data-bus-contacting unit connected via an internal data-bus line, and a connecting unit for connecting bus subscribers. The control electronics is in this context arranged within a metal housing comprising a housing face with a receptacle for a carrier rail, a housing face with a recess for the connecting unit of the control electronics and a housing side face. The housing side face comprises a first opening for the data-bus-contacting unit and a second opening for the electrical contacting unit. Furthermore, a coupling plate for mounting onto the housing side face is provided having a first recess with an engagement feature in the region of the first opening of the housing side face and a second recess with an engagement feature in the region of the second opening of the housing side face. The coupling plate is made from a non-metallic material. The non-metallic material may be an electrical insulator.

In the electronic terminal block, a first and a second electrical contacting unit may be connected via the internal current line, and a first and second data-bus contacting unit may be connected via an internal data-bus line. A first housing side face then has a first opening for the first data-bus-contacting unit of the control electronics and a second opening for the first electrical contacting unit of the control electronics. A second housing side face opposite to the first housing side face comprises a first opening for the second data-bus contacting unit of the control electronics and a second opening for the second electrical contacting unit of the control electronics. A first coupling plate for mounting onto the first housing side face comprises a first recess with an engagement feature in the region of the first opening of the first housing side face and a second recess with an engagement feature in the region of the second opening of the first housing side face. A second coupling plate for mounting onto the second housing side face has a first recess with engagement feature in the region of the first opening of the second housing side face and a second recess with an engagement feature in the region of the second opening of the second housing side face. The first and the second coupling plate consist of a non-metallic material. The non-metallic material may be an electrical insulator.

The embodiment of the terminal block having a metal housing with coupling plates made form an electrical insulating material arranged laterally allows for a compact bus-terminal station in which the terminal blocks are densely packed in a side-by-side arrangement. The metal housing provides for a shielding of the control electronics against incident radiation, in particular magnetic radiation. Moreover, the metal housing allows for dissipating the heat generated by the control electronics. The coupling plates, in turn, provide electrical insulation between the individual electronic terminal blocks.

Due to the openings in the housing side faces and the corresponding associated openings in the coupling plates it is furthermore possible to provide a pluggable wiring of the internal current line as well as of the internal data line via the contacts arranged in the metal housing. The engagement features provided in the regions of the recesses of the coupling plates which are aligned with the openings in the associated housing side faces provide insulation, preferably electrical insulation of the contacts of the electronic terminal blocks with regard to the metal housing. Within the framework of the bus-terminal station, the electronic terminal blocks may be mixed up or even enlarged in any desired arrangement, regardless of the respectively associated functionality, i.e. the signal configuration of the terminal blocks. Each electronic terminal block in a bus-terminal station may in this context be replaced by another electronic terminal block or be completely taken out of the assemblage by pulling out the electronic terminal block and sliding the other electronic terminal blocks together.

The coupling plates are formed in such a way that one coupling plate comprises two laterally protruding c-shaped rails for engaging with slits and the other coupling plate comprises two lateral slits for engaging with the c-shaped rails. This embodiment of the coupling plates allows for integrating the terminal blocks by inserting into the bus-terminal station or, respectively, for removing the terminal blocks by pulling out from the bus-terminal arrangement during the assembly of electronic terminal blocks within the framework of a bus-terminal station.

The first electrical contacting unit comprises at least one contact pin and the second electrical contacting unit comprises at least one contact opening. The engagement feature of the second recess of the first coupling plate extends between the contact pin and the second opening of the first housing side face. The engagement feature of the second recess of the second coupling plate extends between the contact opening and the second opening of the second housing side face. This embodiment allows for establishing a simple electrical contacting of the current-line contacts between adjacent electronic terminal blocks, wherein the engagement features at the coupling plates provide a reliable galvanic separation of the dragged-through current line from the surrounding metal housing.

The second recess of the first coupling plate is in this context formed as a slit hole in a guiding slit running across the outside of the contact plate. This embodiment allows for contacting by simply sliding together the electronic terminal blocks alongside the coupling plates.

The engagement feature of the first recess of the first coupling plate secures the first data-bus contacting unit, and the engagement feature of the first recess of the second coupling plate secures the second data-bus contacting unit. By securing the two data-bus contacting units of the electronic terminal block, a secure contacting to an adjacent electronic terminal block is provided in order to drag the data bus through the electronic terminal block.

The first and the second coupling plate each comprise a third recess for engaging a cross contact with the housing side face. The cross contacting allows for providing potential equalization between adjacent electronic terminal blocks in order to reduce interference voltages.

Furthermore, a thermal base is provided that connects the control electronics to the metal housing and provides improved dissipation of the heat from the control electronics. In addition, it is helpful in this context when two opposite side faces each provide an air vent which allows for an improved heat dissipation from the metal housing.

Adjacent to the housing front side, a screw adaptor may be provided. This extended embodiment allows for guiding cables to the electronic terminal block in a simple manner.

The metal housing is preferably cast or milled, thus allowing for simple and inexpensive manufacture. Alternatively, 3D printing may be used in order to allow for a manufacture specifically adapted to spatial demands.

A bus-terminal station consists of a bus coupler and a plurality of electronic terminal blocks which may be arranged side by side on a carrier rail, wherein at least one of the electronic terminal blocks may be configured in the above-mentioned manner. Such a bus-terminal station is characterized by a compact design which may be used in any desired and even rough environments. In this context, it is possible to connect electronic terminal blocks having a metal housing and lateral coupling plates made from electrically insulating materials to terminal blocks with plastic housings, as well.

BRIEF DESCRIPTION OF THE DRAWINGS

The invention will be discussed in more detail below on the basis of figures. Here, in a schematic illustration in each case.

DETAILED DESCRIPTION

Figure 1:
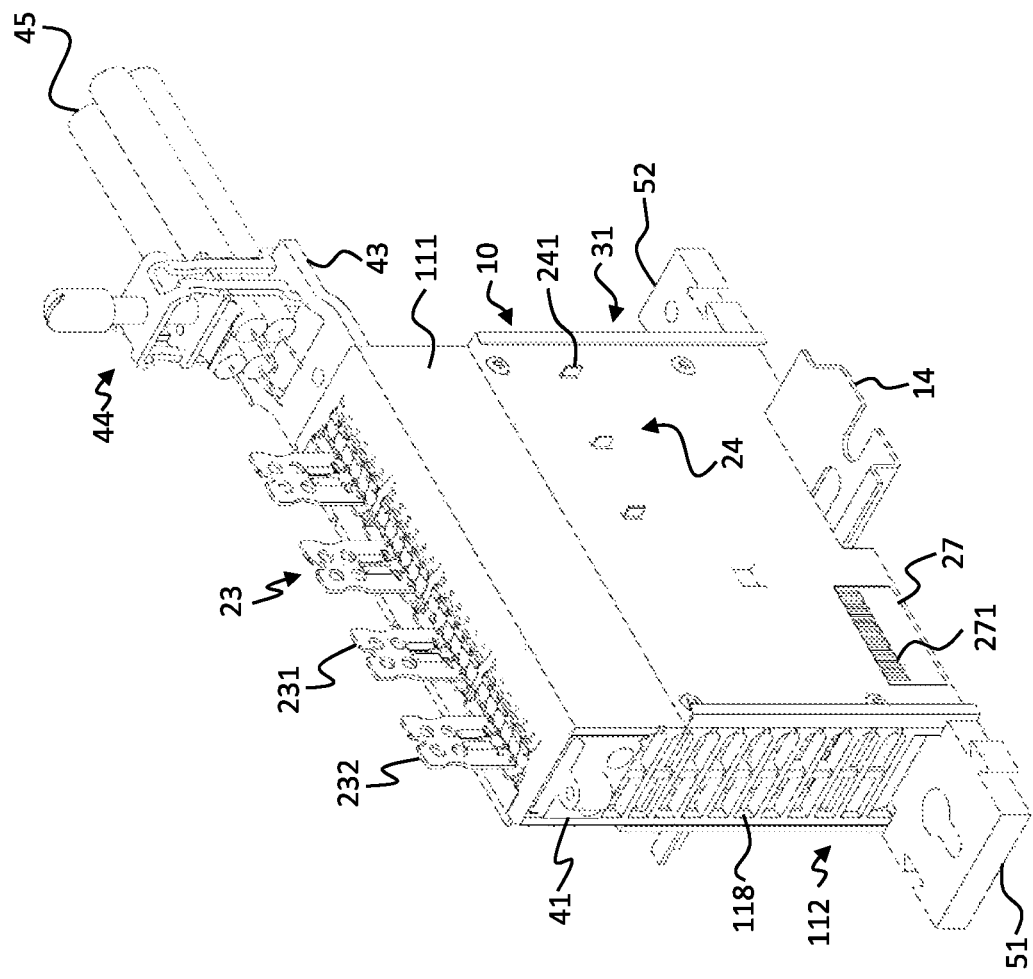
FIG. 1 shows an electronic terminal block in a right-front perspective view.

In the following, same reference numerals stand for the same features. For clarity's sake, the figures may not always contain all reference numerals and/or all features.

Electronic terminal blocks are used in order to wire analogue and digital inputs and outputs and to connect them to a control unit via a field bus. The electronic terminal blocks are generally used within the framework of bus-terminal stations in which a plurality of electronic terminal blocks are interconnected and connected to the field bus via a bus coupler. Bus-terminal stations are needed in industrial automation, however, they can be used in any other field such as in building automation. The individual electronic terminal blocks may in this context be respectively configured for specific digital and/or analogue signal types. Any desired intelligent sensors and actuators may be connected to the terminal blocks.

Figure 2:
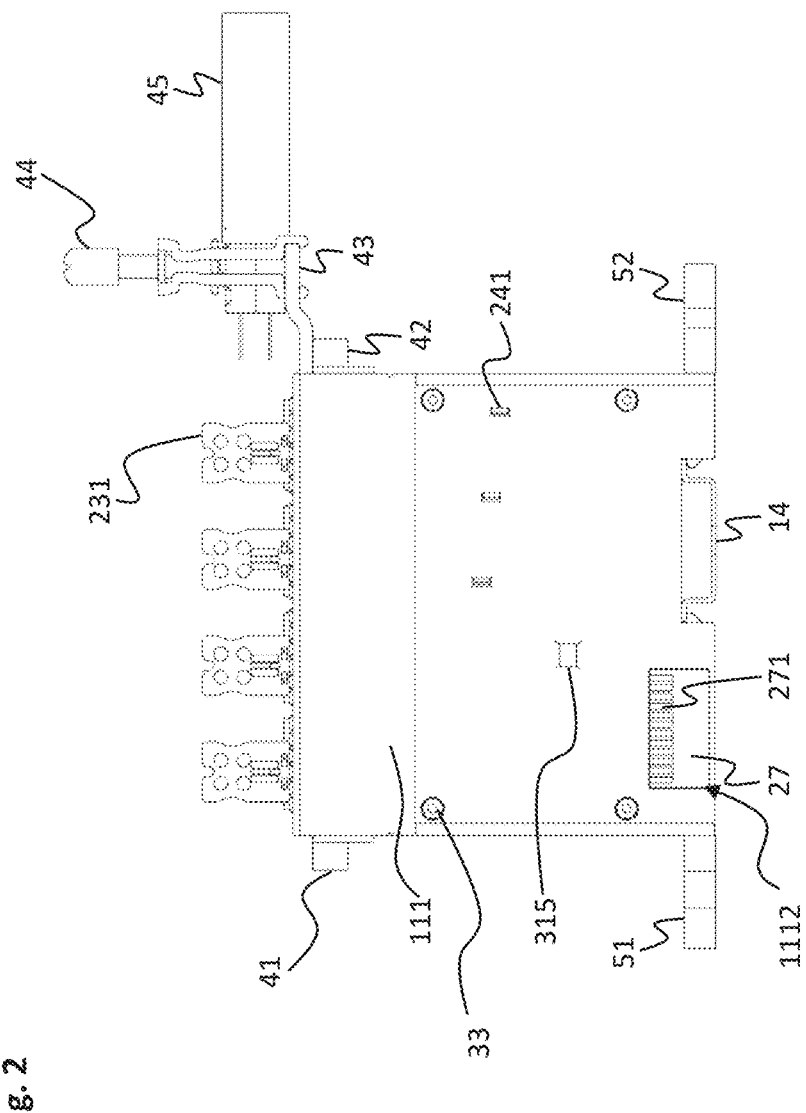
FIG. 2 shows the electronic terminal block of FIG. 1 in a lateral view from the right.
Figure 3:
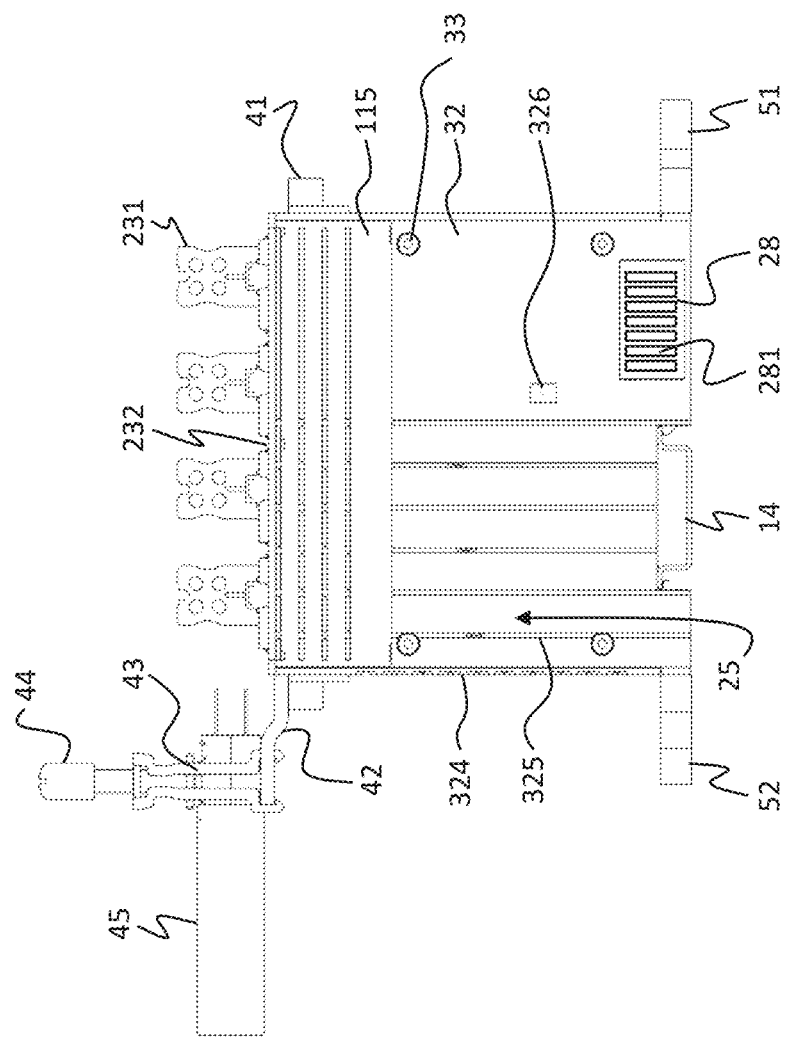
FIG. 3 shows the electronic terminal block of FIG. 1 in a lateral view from the left.
Figure 4:
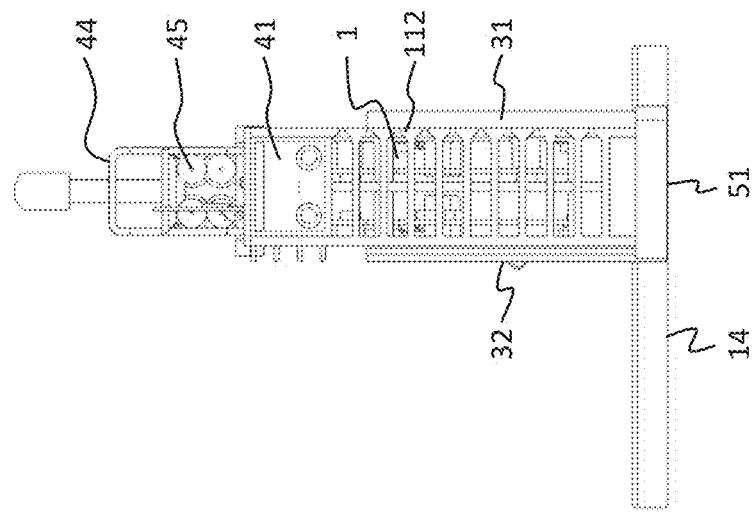
FIG. 4 shows the electronic terminal block of FIG. 1 in a front view.
Figure 5:
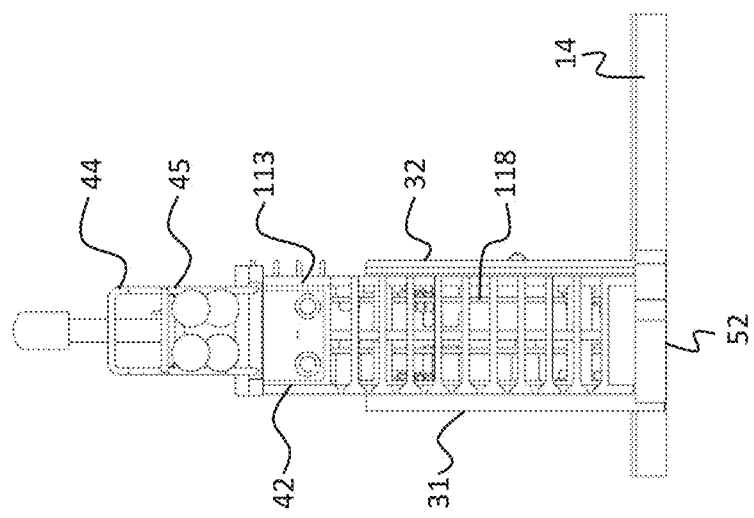
FIG. 5 shows the electronic terminal block of FIG. 1 in a rear view.
Figure 6:
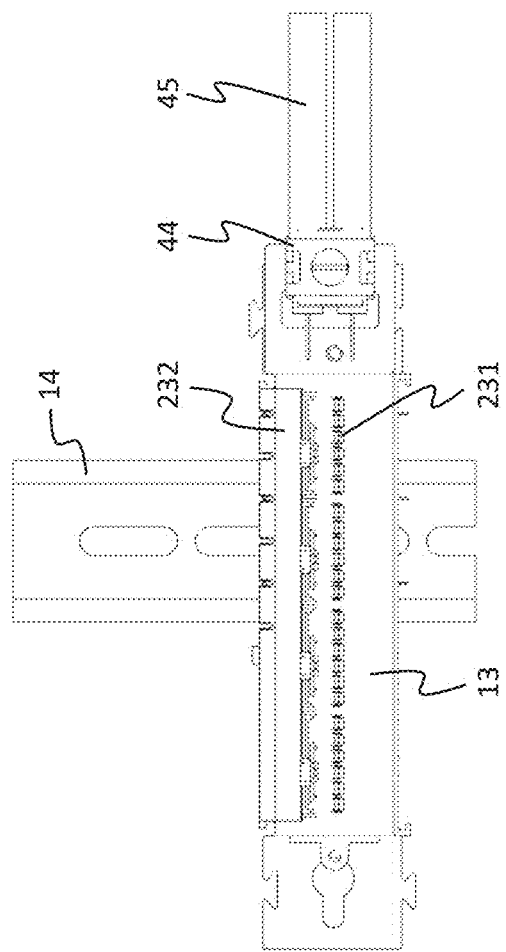
FIG. 6 shows the electronic terminal block of FIG. 1 in a top view.
Figure 7:
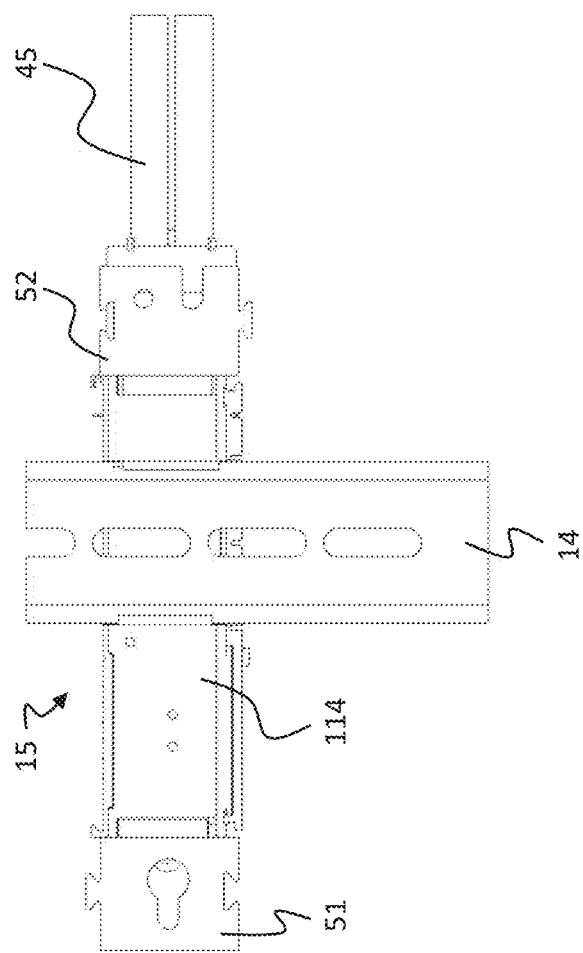
FIG. 7 shows the electronic terminal block of FIG. 1 in a bottom view.
Figure 8:
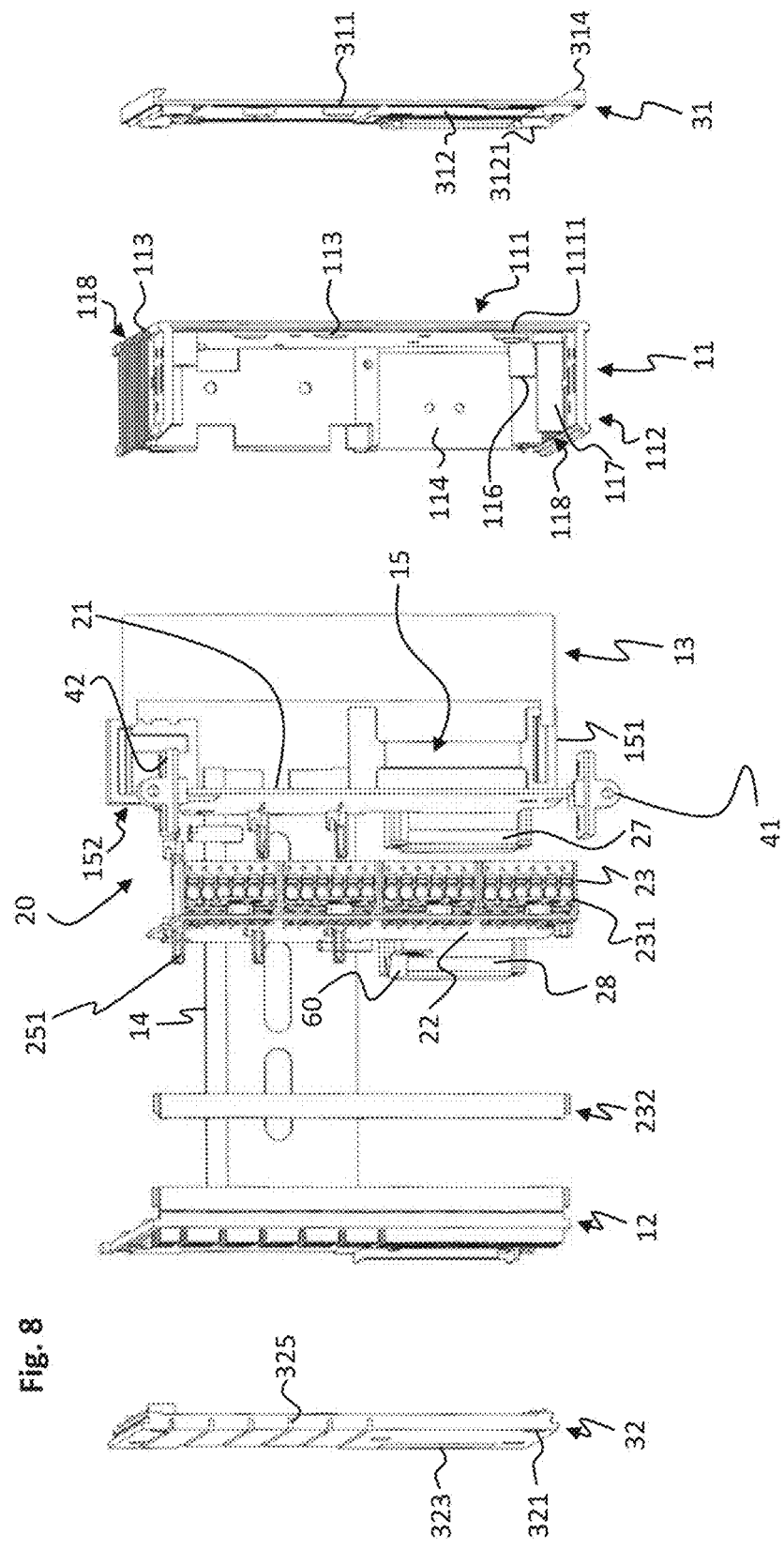
FIG. 8 shows the electronic terminal block of FIG. 1 in an exploded view.
Figure 9:
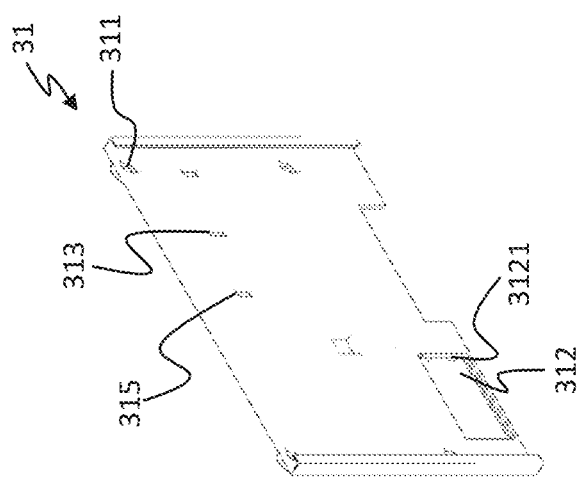
FIG. 9 shows the coupling plate on the right of the electronic terminal block of FIG. 1 in a perspective view from the outside.
Figure 10:
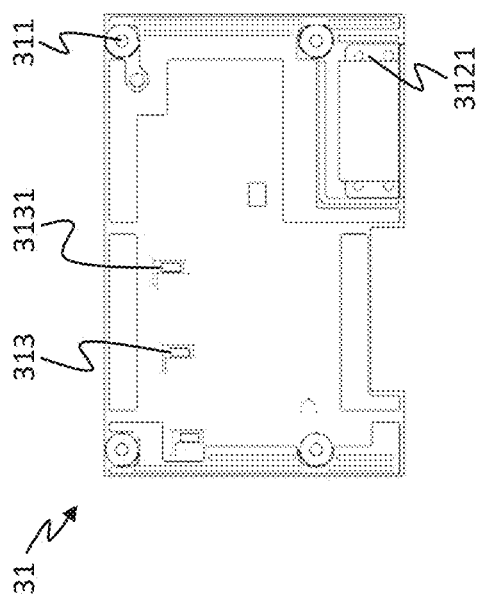
FIG. 10 shows the coupling plate on the right of the electronic terminal block of FIG. 1 in a perspective view from the inside.
Figure 11:
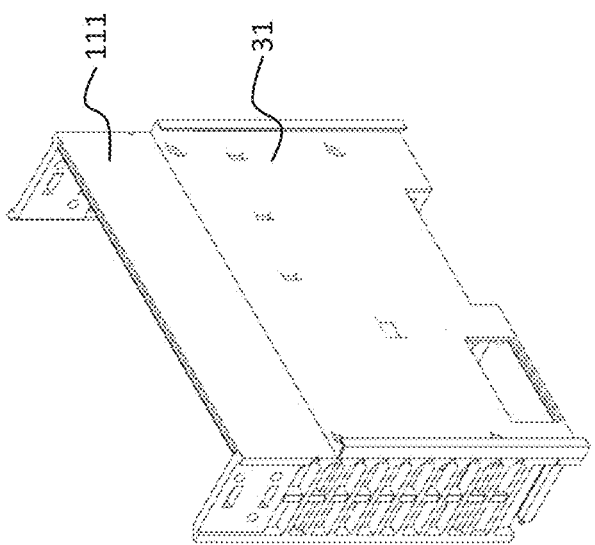
FIG. 11 shows the base trough and coupling plate on the right of the electronic terminal block of FIG. 1 in a perspective view from the outside.
Figure 12:
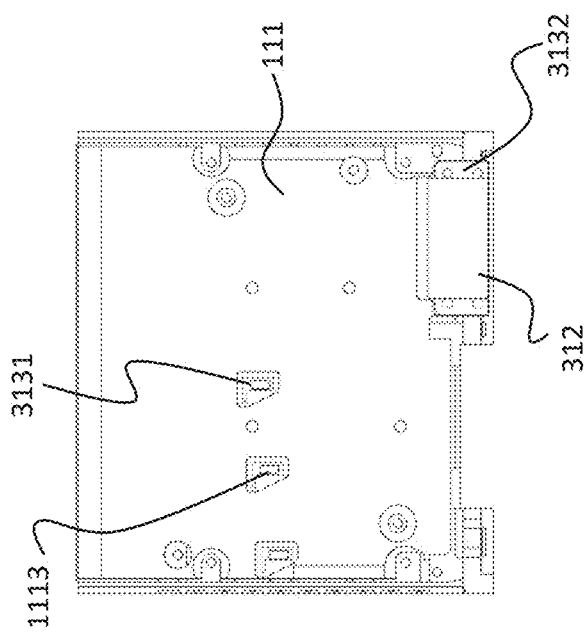
FIG. 12 shows the base trough and coupling plate on the right of the electronic terminal block of FIG. 1 in a perspective view from the inside.

FIGS. 1 to 16 show an embodiment of an electronic terminal block, wherein FIG. 1 depicts the electronic terminal block in a perspective angular view from the front right. FIGS. 2 and 3 each show the lateral views from the right and the left. FIG. 4 is a front view and FIG. 5 a rear view. The top and bottom views are depicted in FIGS. 6 and 7. FIG. 8 is an exploded view of the electronic terminal block wherein segmentation into components was carried out starting from the depiction of the terminal block in FIG. 1. FIGS. 9 to 16 show individual components from the exploded view.

The electronic terminal block comprises a metal housing 10. The metal housing 10 consists of a base trough 11, a base lid 12 and a front lid 13. The base trough 11 comprises the right housing side face 111, the upper and lower housing side faces 112, 113 and the rear face lid 114 and has an integral configuration. The base lid 12 forms the left housing side face 115. The metal housing 10 here has the shape of a rectangular box. It is, however, possible to confer any desired outer shape to the metal housing 10.

In the metal housing 10, a control electronics 20 is arranged and distributed to a right circuit board 21 and a left circuit board 22. The right and the left circuit board 21, 22 are arranged standing upright and side-by-side in the base trough 11. In order to secure the circuit boards 21, 22 in the metal housing 10, screwing domes 116 are provided in the base trough 11 on the right housing side face 111 or, respectively, at the base lid 12, onto which the circuit boards 21, 22 are screwed on. Depending on the configuration of the electronic terminal block and the installation size of the metal 10, it is possible to arrange more or less circuit boards in the metal housing. The components of the control electronics may, instead of on printed boards, also be arranged on differently configured carriers which are then accommodated or, respectively, fastened within the metal housing.

The control electronics 20 further comprises a connector strip 23 which is plugged and screwed onto the left circuit board 22 of the control electronics 20. The connector strip 23 has four slots 231 on its upper side for sensor or, respectively, actuator contacts. Depending on the configuration of the electronic terminal block or, respectively, the installation size, it is possible to provide more or less slots. Instead of slots, the connector strip 23 may have contacts of different configuration, e.g. terminals in the shape of the so-called cage-clamp technology (also referred to as spring-loaded terminals). The number of contact channels for each slot may correspondingly be chosen according to the number of input and output signals of the sensors or actuators to be connected.

On the connector strip 23, an LED prism 232 is further provided along the slots 231, by which the activity of the electronic terminal block, particularly the signal input and output via the slots may be indicated. The connector strip 23 of the control electronics 20 is partially covered by the front lid 13, wherein the front lid 13 comprises a lateral recess through which the slots 231 of the connector strip 23 protrude. Furthermore, the LED prism 232 is embedded in the recess in the front lid 13.

The base trough 11, the base lid 12 and the front lid 13 are fastened to one another by continuous screwing domes 117 arranged at the base trough 11 or, respectively, at the front lid 13. In the base trough 11, slit air grids 118 are arranged at the upper and lower housing side face 112, 113 in order to dissipate the heat of the control electronics 20 from the metal housing 10.

The control electronics 20 comprises a right electrical contacting unit 24 and a left electrical contacting unit 25, which are connected via an internal current line in order to drag a current supply through the electronic terminal block. In this context, the supply of current is effected by a three-wire system. The right electronic contacting unit 24 is configured in the shape of three protruding contact pins 241 on the right circuit board 21. The left electrical contacting unit 25 is arranged on the left circuit board 22 and comprises U-shaped contact bushings 251 which are suitable for receiving contact pins 241 of the right contacting unit 24.

The internal current line connects the three contact pins 241 of the right contacting unit 24 on the right circuit board 21 to the U-shaped contact bushings 251 of the left contacting unit 25 on the left circuit board 22 if the circuit boards 21, 22 are in the correct positions within the metal housing 10. The internal current line is in turn preferably configured as a contact-pin-contact-bushing arrangement, wherein U-shaped contact bushings of the internal current line are arranged on the inner side of the right circuit board 24 opposite to the outer contact pins 241 of the right contacting unit 24. Moreover, the contact pins of the internal current line are arranged on the inner side of the left circuit board 22 and are connected to the outside U-shaped contact bushings 251 of the left contacting unit 25. During assembly, the contact pins of the internal current line on the right circuit board 21 then engage with the U-shaped contact bushings of the internal current line on the left circuit board 22 and thus provide current transmission.

The control electronics 20 furthermore comprises a right data-bus contacting feature 27 and a left data-bus contacting feature 28, by which a data bus may be dragged through the electronic terminal block. The right and left data-bus contacting features 27, 28 are each formed as contact blocks and arranged at the lower edge of the right or, respectively, left circuit board 21, 22.

The right data-bus contacting feature 27 connected to the right circuit board 21 comprises contact ties 271 on its outer side serving as contacting unit; this is shown in the right-hand view of FIG. 2. On the left data-bus contacting 28 associated with the left circuit board 22, spring-pressure clamps 281 are provided as contacting unit, which are aligned on the right data-bus contacting feature 27 corresponding to the contact ties 271; this is shown in the left-hand view of FIG. 3. The right and left data-bus contacting 27, 28 may be coupled to each other in a pluggable manner and form a continuous internal data-bus line if the right circuit board 21 is positioned in the metal housing 10 with the right data-bus contacting 27 and the left circuit board 22 is positioned in the metal housing 10 with the left data-bus contacting 28.

As furthermore shown in the exploded view of FIG. 8, the electronic terminal block comprises a coupling plate 31, 32 on the right housing side face 11 of the base trough 11 and the left housing side face 115 of the base lid 12, respectively. The right coupling plate 31 is depicted in a perspective outside view in FIG. 9 and in an inside top view in FIG. 10. The base trough 11 is shown with a mounted right coupling plate 31 in a perspective outside view in FIG. 11 and in an inside top view in FIG. 12.

The right coupling plate 31 has four screw holes 311 on its inner side for receiving screws 33 which may be screwed into associated screw-in openings 1111 on the right housing side face 111. The screw holes 311 on the right coupling plate 31 are broader on the outer side and have a dome-shape on the inner side so that the screws 33 can be arranged in the right coupling plate 31 in a sunk-in manner, thus also providing a plane surface on the outer side of the right coupling plate 31. The screw domes of the screw holes 311 in the right coupling plate 31 further engage with associated screw-in openings 1111 having a likewise dome-shaped form and located in the right housing side face 111 and thus provide a good positioning of the right coupling plate 31 on the right housing side face 111 during assembly.

As an alternative to a screw fastening of the right coupling plate 31 on the right housing side face 111 of the base trough 11, it is also possible to fasten the coupling plate 31 to the housing side face 111 in a detachable manner by differently configured fastenings. Alternatively, however, a firm connection may be provided e.g. by gluing the right coupling plate 31 onto the right housing side face 111.

In the right housing side face 111 of the base trough 11, a rectangular opening 1112 is provided from which the right data-bus contacting 27 of the right circuit board 21 protrudes which its outer side on which the contact ties 271 are arranged if the right circuit board 21 is positioned in the metal housing 10, as shown in the right-hand view of FIG. 2. The right coupling plate 31 comprises a corresponding rectangular recess 312 in the right coupling plate 31 in the region of the rectangular opening 1112 of the right housing side face 111, wherein, as shown in the inside view of FIG. 12, the rectangular recess 312 comprises a protruding enclosure 3121 extending into the rectangular opening 1112 in the right housing side face 111.

The right housing side face 111 of the base trough 11 further comprises three openings 1113 configured as vias to which three slit openings 313 are adjusted in the right coupling plate 31 through which the three contact pins 214 of the right electrical contacting unit 24 on the right circuit board 21 extend if the right circuit board 21 is positioned in the metal housing 10, as shown in the right-hand view of FIG. 2. The three slit openings 313 of the right coupling plate 31 are provided with protruding enclosures 3131 engaging with the vias 1113 of the right housing side face 111, as shown in the inside view in FIG. 12. By this arrangement, a reliable galvanic separation of the inserted contact pins from the surrounding metal housing can be achieved.

Figure 13:
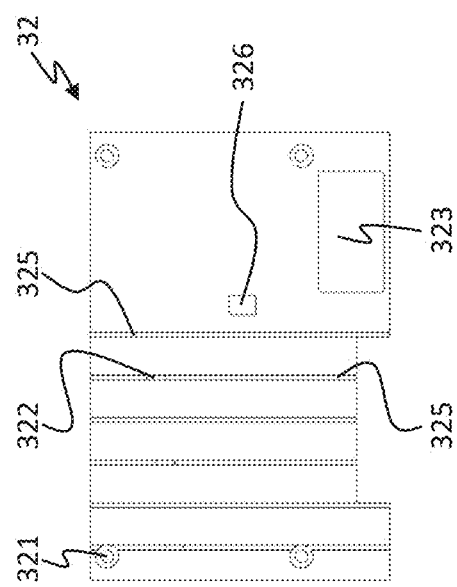
FIG. 13 shows the coupling plate on the left of the electronic terminal block of FIG. 1 in a lateral view from the outside.
Figure 14:
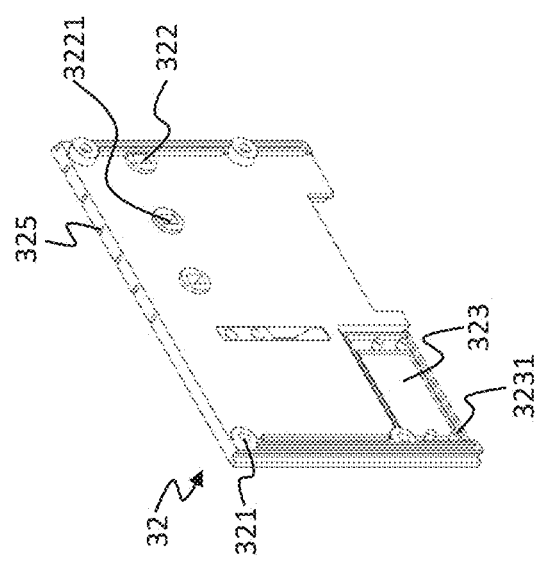
FIG. 14 shows the coupling plate on the left of the electronic terminal block of FIG. 1 in a perspective view from the inside.

The left coupling plate 32 for mounting on the left base lid 12 constituting the left housing side face 115 is depicted in an inside top view in FIG. 13 and in an outside perspective view in FIG. 14. The base lid 12 with the mounted left coupling plate 32 is shown in an inside top view in FIG. 15 and in an outside perspective view in FIG. 16.

The left coupling plate 32 in turn comprises four screw holes 321 with an inner dome engaging with corresponding screw-in domes 1151 at the base lid 12. By means of screws 33 sunk into the left coupling plate 32 so that a plane surface results on the outer side of the left coupling plate 32, the left coupling plate may be fastened to the base lid 12. However, as already mentioned in context with the right coupling plate 31, alternative fastenings are possible.

In adjustment to three openings 1152 configured as vias in the left base lid 12, three recesses 322 for the contact bushings 251 of the left electrical contacting unit 25 are provided in the left coupling plate 32. The three recesses 322 in turn comprise enclosures 3221 protruding inwardly and enclosing the recesses and engaging with the corresponding vias 1152 in the left base lid 12. If the left circuit board 22 is positioned in the metal housing 10 and the contact bushings 251 extend through the three vias 1152 in the left base lid 12 as shown in the left-hand view of FIG. 3, the contact bushings 251 of the left electrical contacting unit 25 are shielded from the surrounding metal housing by the enclosures 1152.

In the left housing side face 115 formed by the base lid 12 a rectangular opening 1153 is provided in which the left data-bus contacting 28 of the left circuit board 22 is arranged with the spring-pressure clamps 281 on the outer side as the contacting unit. The left coupling plate 32 comprises a corresponding rectangular recess 323 in the region of the rectangular opening 1153 of the left housing side face 115. As shown in the perspective view of FIG. 16, a protruding enclosure is provided at the rectangular recess 323 which extends into the rectangular opening 1153 in the left housing side face 115.

The metal housing 10 is preferably cast or milled, thus allowing for inexpensive manufacture. Alternatively, 3D printing may be used in order to allow for a production specifically adapted to the spatial conditions. By using a metal housing, an effective shielding in particular against magnetic interferences may be achieved. At the same time, the metal corpus provides an improved heat dissipation of the control electronics 20. The right and left coupling plates 31, 32, on the other hand, are made from a non-metallic material, preferably an electrical insulator, particularly plastic.

By the engagement features at the openings in the contact plates 31, 32, in particular by the protruding enclosures 3131, 3221 of the slit openings 313 and of the recesses 322 for the contact pins 241 or the U-shaped contact bushings 251 of the right and left electrical contacting units 24, 25, an electrical insulation of the current passing through may be guaranteed. The enclosures 3121, 3231 in the region of the rectangular recesses 312, 323 for the right or, respectively, left data-bus contacting features 27, 28 in the contact plates 31, 32 serve to secure the position of the data-bus contacting features and allow for simplified connecting. The enclosures 3131, 3221 of the slit openings 313 and of the recesses 322 and the enclosures 3121, 3231 in the region of the rectangular recesses 312, 323 do not have to have a closed configuration and may also be differently formed. The shape of the slit openings 313 as well as the recesses 312, 322, 323 may be varied and configured as an opening adapted to the respective function.

Figure 15:
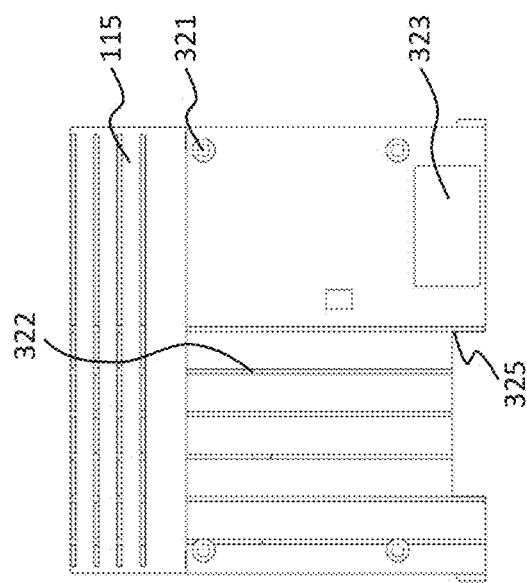
FIG. 15 shows the base lid and coupling plate on the left of the electronic terminal block of FIG. 1 in a lateral view from the outside.
Figure 16:
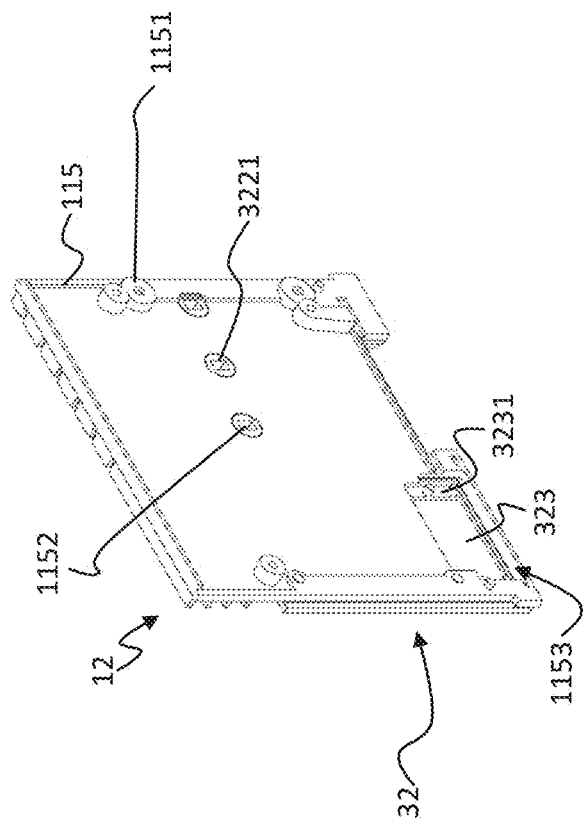
FIG. 16 shows the base lid and coupling plate on the left of the electronic terminal block of FIG. 1 in a perspective view from the inside.

The electronic terminal block is configured to be mounted onto a carrier rail 14, as shown in FIGS. 1 to 8. In the base trough 11, a continuous U-shaped indentation is provided in the rear lid by which the base trough 11 may be mounted onto the carrier rail 14. At the rear lid 114 of the base trough, a locking system 15 shown in the exploded view of FIG. 8 is arranged, consisting of a moveably arranged lower locking element 151 and a rigidly arranged upper locking element 152. If the carrier rail 14 in the U-shaped indentation rests on the upper locking element 152 at the rear lid 114 of the base trough 11, the lower locking element 151 may be engaged with the carrier rail 14 in order to secure the base trough 11 at the carrier rail 14. FIG. 15 shows a bottom view in which the electronic terminal block is placed onto the carrier rail 14 and secured there by the locking system 15.

Figure 17:
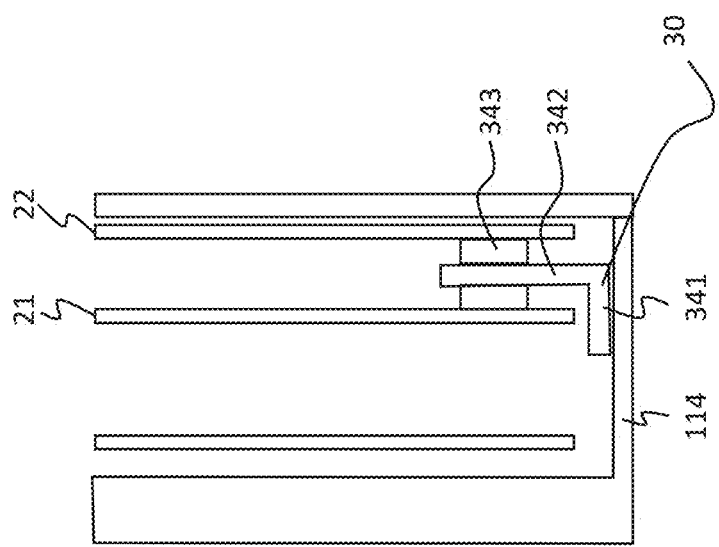
FIG. 17 shows a further electronic terminal block with a thermal base wherein a section of a cross-section through the electronic terminal block is depicted.

In order to provide an improved heat dissipation from the control electronics 20, a thermal base may further be provided in the electronic terminal block which is in thermal contact with the circuit boards 21, 22 of the control electronics 20 and establishes a connection to the metal housing 10. FIG. 17 shows an embodiment with an L-shaped thermal base 30 that rests at the rear lid 114 with a foot area 341 and extends between the circuit boards 21, 22 of the control electronics with an arm area 342. The arm area 342 extending between the circuit boards is herein connected to the circuit boards 21, 22 by thermally conductive elements 343, such as thermally conductive pastes.

The metal housing 10 of the electronic terminal block further comprises, as shown in FIGS. 1 to 7, screw adaptors 41, 42 at the upper and lower housing side faces 112, 113 of the base trough 11 adjoining the slit air grid 118. A cable holder 43 as shown in FIGS. 1 to 7 may be screwed to the screw adaptors 41, 42 and comprise a cable clamp 44 for holding cables 45, via which signals or currents may be guided to the electronic terminal block.

In the upper and lower housing side face 112, 113 of the base trough 11, engagement features are provided adjacent to the rear lid 114, into which lateral assembly flanges 51, 52, as shown in FIG. 1, may be inserted. By means of the assembly flanges 51, 52 in which screw holes are formed, the electronic terminal block may e.g. be fastened to a switch-cabinet back wall in addition to engaging with the carrier rail 14. The assembly flanges 51, 52 further provide an improved heat dissipation from the metal housing 10.

Figure 18:
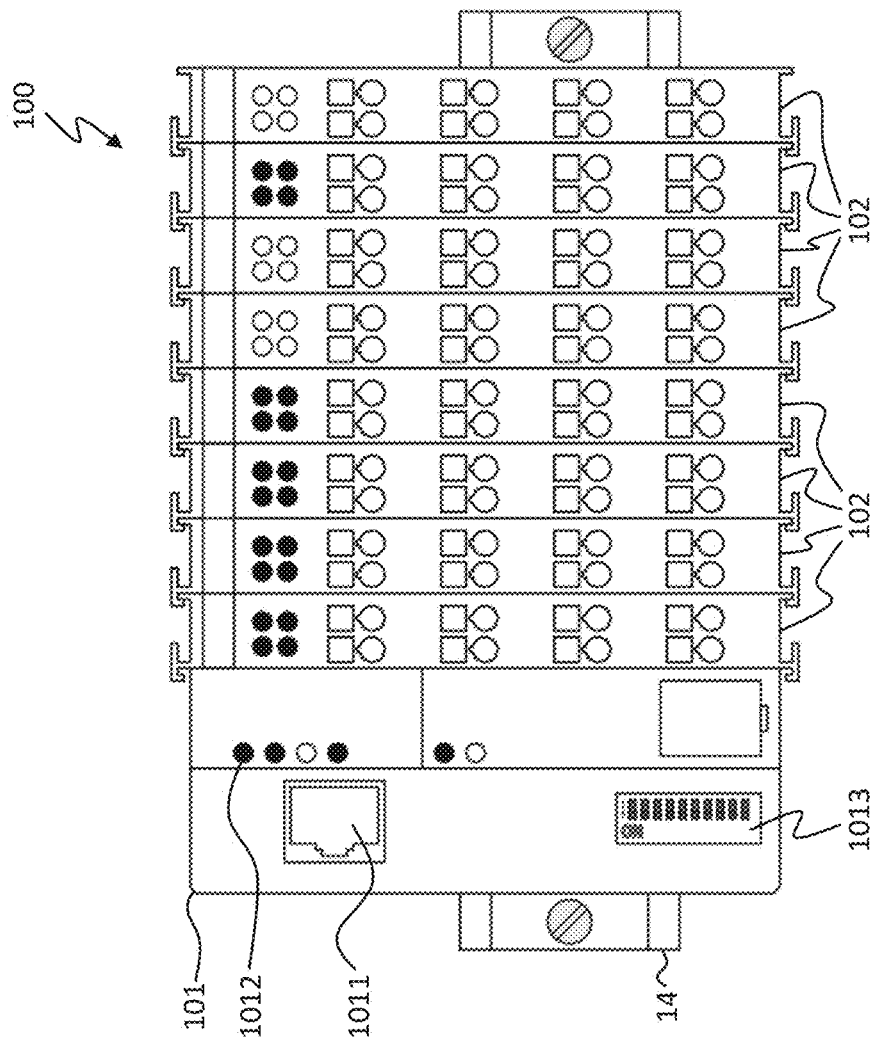
FIG. 18 shows a bus-terminal station having a bus coupler and eight electronic terminal blocks.

Electronic terminal blocks are generally arranged on the carrier rail 14 together with other terminal blocks and form a bus-terminal station 100, as shown in FIG. 18. In order to allow for stringing the electronic terminal blocks, C-shaped bars are provided on one side of the electronic terminal blocks which engage with U-shaped slits on the other side of the electronic terminal block.

In the electronic terminal block of FIGS. 1 to 16 having a metal housing 10 and lateral coupling plates 31, 32, two C-shaped rails 314 are arranged at the right coupling plate 31. In this case, two slits 324 are formed in the left coupling plate 32. The C-shaped rails 314 at the right coupling plate 31 may engage with the slits 324 of the left coupling plate 32 when mounting an electronic terminal block on an adjacent electronic terminal block that has already engaged with the carrier rail 14 in order to form the bus-terminal station 100. The tongue-and-groove joint provides a simplified stringing process and secures the terminal block assemblage in addition to the locking on the carrier rail.

In order to be able to position the contact pins 241 of the first electrical contacting unit 24 protruding from the coupling plate 31 when mounting the electronic terminal block onto an adjacent electronic terminal block, the left coupling plate 32 comprises guiding slits 325 as shown in the outside view of FIG. 13 running in parallel to the outer edges of the left coupling plate 32 and comprising the recesses 322 for the contact bushings 251 of the second electrical contacting unit 25.

In order to insert an electrical terminal block into a bus-terminal station, the C-shaped rails 314 of the right coupling plate 31 of the electrical terminal block are inserted into the slits 324 of the left coupling plate 32 of the adjacent electrical terminal block already locked on the carrier rail. The electrical terminal block is then slid on alongside the adjacent electrical terminal block, wherein the protruding contact pins 241 of the electrical terminal block run in the guiding slits 325 of the left coupling plate 32 of the adjacent electrical terminal block until the electrical terminal block locks with the carrier rail 14. In the end position, the contact pins 241 of the electrical terminal block then engage with the U-shaped contact bushings 251 of the adjacent electrical terminal block and thus provide the passage of current. A continuous electrical connection is created so that the voltage supply may be dragged through the terminal blocks in the bus-terminal station.

After the electrical terminal block has locked with the carrier rail 14, the spring-pressure clamps 281 of the left data-bus contacting 28 of the adjacent electrical terminal block simultaneously press against the contact ties 271 of the right data-bus contacting 27 of the electrical terminal block and thus produce a continuous data connection. The data bus dragged through the terminal block is preferably an E or K bus.

In order to provide a potential equalization between the electronic terminal blocks having a metal housing independently from the carrier rail 14, a further cross contact 60 is provided which can be configured as a spring contact as shown in the exploded view of FIG. 8. The cross contact 60 is arranged on the base lid 12 and extends through a further recess 326 in the left coupling plate 32, as shown in the left-hand view of FIG. 3. In the right coupling plate 31, an additional recess 315 is then provided which has been adjusted to the recess 326 at the left coupling plate 32 for the cross contact 60 so that the cross contact of an adjacent electronic terminal block may engage in order to produce a potential equalization.

The bus-terminal station 100 shown in FIG. 18 comprises a bus coupler 101 and eight subsequent terminal blocks 102 as a head end. The bus coupler 101 comprises a slot 1011 for a bus cable which is configured as a RY45 socket, and serves as an interface with the field bus in order to connect the electronic terminal block to a control unit. On the front side of the bus coupler 101, LEDs 1012 are provided that indicate the operational mode. The bus coupler 101 further comprises an address switch 1013, a so-called dual-inline-package switch by which the address of the bus coupler may be set.

The electronic terminal blocks 102 that are connected to the bus coupler 101 and correspond to the terminal blocks shown in FIG. 8, contrary to the terminal block shown in FIGS. 1 to 16 comprise clamp contacts in cage-clamp technology instead of plug connectors on the front side for connecting actuators or, respectively, sensors. In addition, the electronic terminal blocks 102 of the embodiment of FIG. 18 are each equipped with LED units above the clamp contacts instead of the LED prism arranged laterally alongside of the slots.

The bus-terminal station 100 may comprise any desired number of plug-connected electronic terminal blocks depending on the embodiment of the current and data connection and the installation size. In this context, electronic terminal blocks in various configurations can be plugged to one another. Thus, apart from electronic terminal blocks as shown in FIGS. 1 to 16, the metal housings and lateral contact plates made from the non-metallic material, preferably electrical insulating material, electronic terminal blocks produced with an exclusively plastic housing may also be used. Moreover, electronic terminal blocks having any desired functionality may occur in mixed arrangement in the bus-terminal station. Each electronic terminal block in the bus-terminal station may be removed from the bus-terminal station in a simple manner by pulling out or, respectively, be replaced by a different electronic terminal block.

If the electronic terminal block is used as an end element, it may only comprise a lateral contact plate. An electronic terminal block then comprises an electrical contacting unit connected via the internal current line and a data-bus contacting unit connected via an internal data-bus line. A housing side face further comprises a first opening for the data-bus contacting unit and a second opening for the electrical contacting unit. Furthermore, a coupling plate for mounting on the housing side face is provided comprising a first recess with an engagement feature in the region of the first opening of the housing side faced and a second recess with an engagement feature in the region of the second opening of the housing side face. In this context, the coupling plate is produced from the non-metallic material, preferably from the electrical insulator.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. An electronic terminal block for a data bus having:
   control electronics comprising a first and a second data-bus-contacting unit connected via an internal data-bus line and a connecting unit for connecting bus subscribers;
   a metal housing in which the control electronics are arranged and which comprises a first housing face having a receptacle in a carrier rail, a second housing face having a recess for the connecting unit of the control electronics, a first housing side face, a first opening for the first data-bus-contacting unit, and a second housing side face opposite to the first housing side face, which comprises a first opening for the second data-bus-contacting unit of the control electronics;
   a first coupling plate for mounting onto the first housing side face, which comprises a first recess having an engagement feature in the region of the first opening of the first housing side face; and a second coupling plate for mounting onto the second housing side face, which comprises a first recess having an engagement feature in the region of the first opening of the second housing side face;

wherein the first and second coupling plates are made of a non-metallic material; and wherein the engagement features comprise protruding enclosures.

2. The electronic terminal block of claim 1, wherein the first coupling plate comprises two laterally protruding C-shaped rails for engaging with slits and the second coupling plate comprises two lateral slits for engaging with the C-shaped rails.

3. The electronic terminal block of claim 1, wherein the engagement feature of the first recess of the first coupling plate secures the first data-bus-contacting unit of the control electronics and the engagement feature of the first recess of the coupling plate secures the second data-bus-contacting unit of the control electronics.

4. The electronic terminal block of claim 3, wherein the first and the second data-bus-contacting unit form a resilience-bus contact comprising at least one outside-pointing contact spring and an associated contact plane.

5. The electronic terminal block of claim 1, wherein the first and the second coupling plate each comprise a third recess for engaging a cross contact on the associated housing side face.

6. The electronic terminal block of claim 1, wherein a thermal base is provided which is in thermal contact with the control electronics and connects the control electronics to the metal housing.

7. The electronic terminal block of claim 1, wherein at least one ventilation aperture is provided in each of two opposite housing side faces.

8. The electronic terminal block of claim 1, wherein two opposite thermally conductive mounting flanges are provided which elongate the housing face comprising the recess for the carrier rail.

9. The electronic terminal block of claim 1, wherein at least one screw adapter is provided adjacent to the housing face comprising the recess for the connecting unit.

10. The electronic terminal block of claim 1, wherein the metal housing is cast or milled or manufactured by a 3D method.

11. The electronic terminal block of claim 1, wherein, preferably an electric insulator non-metallic material.

12. An electronic terminal block for a data bus having:
control electronics comprising an electrical contacting unit connected via an internal current line, a data-bus-contacting unit connected via an internal data-bus line and a connecting unit for connecting bus subscribers;
a metal housing in which the control electronics are arranged and which comprises a first housing face having a receptacle in a carrier rail, a second housing face having a recess for the connecting unit of the control electronics and a housing side face, wherein the housing side face comprises a first opening for the data-bus-contacting unit of the control electronics and a second opening for the electrical contacting unit of the control electronics; and
a coupling plate for mounting onto the housing side face, which comprises a first recess having an engagement feature in the region of the first opening of the first housing side face as well as a second recess having an engagement feature in the region of the second opening of the housing side face;

wherein the coupling plate is made of a non-metallic material, preferably an electrical insulator; and wherein the engagement features comprise protruding enclosures.

13. The electronic terminal block of claim 12,
wherein a first and a second electrical contacting unit are connected via an internal current line;
wherein a first and a second data-bus-contacting unit are connected via an internal data-bus line, wherein a first housing side face comprises a first opening for the first data-bus-contacting unit of the control electronics and a second opening for the first electrical contacting unit of the control electronics, wherein a second housing side face opposite to the first housing side face comprises a first opening for the second data-bus-contacting unit of the control electronics and a second opening for the second electrical contacting unit of the control electronics;

wherein a first coupling plate for mounting on the first housing side face comprises a first recess having an engagement feature in the region of the first opening of the first housing side face and a second recess having an engagement feature in the region of the second opening of the first housing side face;

wherein a second coupling plate for mounting on the second housing side face comprises a first recess having an engagement feature in the region of the first opening of the second housing side face and a second opening having an engagement feature in the region of the second opening of the second housing side face;

wherein the first and the second coupling plate are made of the non-metallic material; and wherein the engagement features comprise protruding enclosures.

14. The electronic terminal block of claim 13, wherein the first coupling plate comprises two laterally protruding C-shaped rails for engaging with slits and the second coupling plate comprises two lateral slits for engaging with the C-shaped rails.

15. The electronic terminal block of claim 13, wherein the first electrical contacting unit comprises at least one contact pin and the second electrical contacting unit comprises at least one contact opening, wherein the engagement feature of the second recess of the first coupling plate extends between the contact pin and the second opening of the first housing side face, and wherein the engagement feature of the recess of the second coupling plate extends between the contact opening and the second opening of the second housing side face.

16. The electronic terminal block of claim 15, wherein the second recess of the second coupling plate is a slit hole in a guiding slit running across the outside of the contact plate.

17. The electronic terminal block of claim 13, wherein the engagement feature of the first recess of the first coupling plate secures the first data-bus-contacting unit of the control electronics and the engagement feature of the first recess of the coupling plate secures the second data-bus-contacting unit of the control electronics.

18. The electronic terminal block of claim 17, wherein the first and the second data-bus-contacting unit form a resilience-bus contact comprising at least one outside-pointing contact spring and an associated contact plane.

19. The electronic terminal block of claim 13, wherein the first and the second coupling plate each comprise a third recess for engaging a cross contact on the associated housing side face.

20. A bus-bar station comprising a bus coupler and a plurality of electronic terminal blocks which may be arranged side-by-side on a carrier rail;
- wherein an electronic terminal bar comprises a metal housing in which the control electronics are arranged and which comprises a first housing face having a receptacle in a carrier rail, a second housing face having a recess for the connecting unit of the control electronics, a first housing side face, a first opening for the first data-bus-contacting unit, and a second housing side face which comprises a first opening for the second data-bus-contacting unit of the control electronics;
- a first coupling plate for mounting onto the first housing side face, which comprises a first recess having an engagement feature in the region of the first opening of the first housing side face;
- a second coupling plate for mounting onto the second housing side face, which comprises a first recess having an engagement feature in the region of the first opening of the second housing side face;
- wherein the first and second coupling plates are made of a non-metallic material; and
- wherein the engagement features comprise protruding enclosures.

21. The bus-bar station of claim 20, wherein the first coupling plate of the electronic terminal block comprises two laterally protruding C-shaped rails for engaging with slits and the second coupling plate comprises two lateral slits for engaging with the C-shaped rails.

22. The bus-bar station of claim 20, wherein in the electronic terminal block the first and the second data-bus-contacting unit form a resilience-bus contact comprising at least one outside-pointing contact spring and an associated contact plane.

23. The bus-bar station of claim 20, wherein in the electronic terminal block the first and the second coupling plate each comprise a third recess for engaging a cross contact on the associated housing side face.

* * * * *